(12) United States Patent
Shyu

(10) Patent No.: US 7,961,896 B1
(45) Date of Patent: Jun. 14, 2011

(54) EXPANDER CIRCUIT WITH REDUCED DISTORTION

(75) Inventor: Ching Shyu, San Jose, CA (US)

(73) Assignee: Plantronics, Inc., Santa Cruz, CA (US)

( * ) Notice: Subject to any disclaimer, the term of this patent is extended or adjusted under 35 U.S.C. 154(b) by 1448 days.

(21) Appl. No.: 11/365,118

(22) Filed: Feb. 28, 2006

(51) Int. Cl.
*H03G 3/00* (2006.01)

(52) U.S. Cl. .......... 381/106; 381/120; 381/28; 381/107; 333/14; 333/32; 333/124; 330/282; 455/72

(58) Field of Classification Search ............ 323/79, 323/80, 81; 325/62, 65; 330/98, 282, 283; 333/14, 4, 5, 32, 124; 381/104, 106, 94.5, 381/107, 28, 71.1, 94.9, 103, 110, 111, 113, 381/121, 120; 455/72
See application file for complete search history.

(56) References Cited

U.S. PATENT DOCUMENTS

| | | | | |
|---|---|---|---|---|
| 3,903,485 A | * | 9/1975 | Dolby | 333/14 |
| 4,012,688 A | * | 3/1977 | Blackburn et al. | 323/354 |
| 4,241,453 A | * | 12/1980 | Drake | 455/219 |
| 4,710,725 A | * | 12/1987 | White et al. | 330/51 |
| 5,337,368 A | * | 8/1994 | Kikuchi et al. | 381/103 |
| 6,549,630 B1 | * | 4/2003 | Bobisuthi | 381/94.7 |
| 7,423,487 B2 | * | 9/2008 | Fornasari et al. | 330/282 |

* cited by examiner

*Primary Examiner* — Vivian Chin
*Assistant Examiner* — Friedrich Fahnert
(74) *Attorney, Agent, or Firm* — The Intellectual Property Law Office of Thomas Chuang

(57) ABSTRACT

Systems for an expander circuit are disclosed. An expander circuit comprising a transmit amplifier for amplifying electrical signals received from a microphone. A rectifier circuit is responsive to the electrical signals and generates a D.C. voltage. A dynamic resistor circuit is coupled to the transmit amplifier for regulating the gain of the transmit amplifier. The dynamic resistor circuit includes a bipolar junction transistor for receiving the D.C. voltage. The bipolar junction transistor is operated such that the collector current is zero and the bipolar junction transistor has a variable impedance seen by the transmit amplifier dependent upon the D.C. voltage.

20 Claims, 6 Drawing Sheets

EXPANDER CIRCUIT WITH REDUCED DISTORTION

BACKGROUND OF THE INVENTION

Voice communication systems, especially those with omnidirectional microphones, tend to pick up background noise. This background noise may include, for example, environmental noise such as other voices or sounds, system noise such as radiofrequency noise, and acoustic echo. The background noise is especially noticeable during periods when the user is not speaking.

To address this problem, conventional voice communication systems typically incorporate some form of voice activated switch or signal expander. Switching solutions use a switch to activate the amplifier only when a voice signal is present. However, sharp switching produces an uncomfortable "swooshing" sound heard by users. Expansion techniques produce a gradual change in gain, yielding a smooth transition between noise (no speech) and speech states.

Prior art expander systems are described for example in U.S. Pat. No. 6,549,630 entitled "Signal Expander with Discrimination Between Close and Distant Acoustic Source" assigned to Plantronics, Inc. FIG. 1 illustrates a functional block diagram of a conventional bi-stable signal expander system 100 comprising a microphone 105, an expander control stage 110, and a variable gain block (stage) 115. The microphone 105 is coupled to the variable gain block 115, and the expander control stage 110 is coupled to the microphone 105 and the variable gain block 115. The expander control stage 110 includes a detector 120 coupled between the microphone 105 and a first input 125 of a comparator 130. The comparator 130 has a second input 135 coupled to a reference (threshold) voltage source 140 for generating a reference voltage level Vref.

When an acoustic source 145 becomes active, the emitted sounds from acoustic source 145 will cause changes in the air pressure. The microphone 105 detects the air pressure changes and translates the air pressure changes into corresponding voltage changes (i.e., microphone output signals 150) that are detected by the detector 120. The detector 120 outputs the microphone output signal 150 as a detector output signal 155. The comparator 130 compares the voltage level of the detector output signal 155 with the reference voltage level Vref from reference voltage source 140. If the voltage level of the detector output signal 155 is below the reference voltage level Vref, then the comparator 130 generates an output signal 160 with a logical state that does not activate the variable gain block 115. As a result, the variable gain block 115 does not add gain to the microphone output signal 150. When the acoustic source 145 activates, the voltage level of the microphone output signal 150 rises.

The detector 120 detects the higher-level microphone output signal 150 and will, as a result, output a higher-level detector output signal 155. If the voltage level of detector output signal 155 rises above the reference voltage level Vref, the comparator 130 outputs an output signal 160 with a logic state that causes the variable gain block 115 to add gain to the microphone output signal 150. The variable gain block 115 then outputs the amplified microphone output signal as an audio output signal 165. Background noise is typically reduced by voice expansion techniques by approximately 10-12 dB during periods in which the user is not speaking.

The above-mentioned bi-stable signal expander systems have a fast attack and slow decay characteristic that causes the switches for controlling gain to respond quickly to a detected sound of a sufficient voltage level and to maintain the gain for a pre-defined time length (e.g., 150 ms to 200 ms) after the voltage level of the detected sound falls below the comparator 130 threshold. By maintaining the gain for the additional pre-defined time length, the quieter-sounding, trailing ends of the speech envelope are not cut off by the bi-stable signal expander system. These trailing ends are typically below the comparator threshold. However, noise is often amplified during the additional pre-defined time length when gain is maintained.

FIG. 2 illustrates a conventional variable gain signal expander system 200 including an expander control stage 205 coupled between the microphone 105 and the variable gain block 115. The expander control stage 205 includes a detector 210 coupled to an amplifier 215. The microphone output signal 150 is detected by the detector 210 and amplified by the amplifier 215. As a result, the amplifier 215 generates a control signal 220 with a magnitude that depends on the initial magnitude of the microphone output signal 150. The amount of gain provided by the variable gain block 115 to the microphone output signal 150 depends on the magnitude of the control signal 220.

However, these and other prior art expander systems have certain performance shortcomings. For example, there is high distortion in the transition mode between a signal with no speech and a signal with user speech (also referred to herein as a "voice signal"). Furthermore, attack and release times not independent or adjustable over a wide range. Thus there is a need for improved expander systems.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

An expander circuit with reduced distortion is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Particular circuit layouts and circuit components may be given for illustrative purposes. This is done for illustrative purposes to facilitate understanding only and one of ordinary skill in the art may vary the design and implementation parameters and still remain within the scope of the invention.

Generally this description relates to circuits that provide non linear gain characteristics and specifically to voice communication circuits providing expansion of voice transmit signals. In one example, the invention uses the low dynamic resistance of a bipolar junction transistor (BJT) in "intersection" mode instead of conventional "saturation" or "active" modes to control the gain of a transmit amplifier. Advantageously, when the BJT is operated in intersection mode no D.C. current is needed and there are no D.C. current changes caused by the BJT in the amplifier controlled by the BJT, resulting in lower distortion in the output of the transmit amplifier.

An expander circuit comprising a transmit amplifier for amplifying electrical signals received from a microphone. A rectifier circuit is responsive to the electrical signals and generates a D.C. voltage. A dynamic resistor circuit is coupled to the transmit amplifier for regulating the gain of the transmit amplifier. The dynamic resistor circuit includes a bipolar junction transistor for receiving the D.C. voltage. The bipolar junction transistor is operated such that the collector current is zero and the bipolar junction transistor has a variable impedance seen by the transmit amplifier dependent upon the D.C. voltage.

Figure 1:
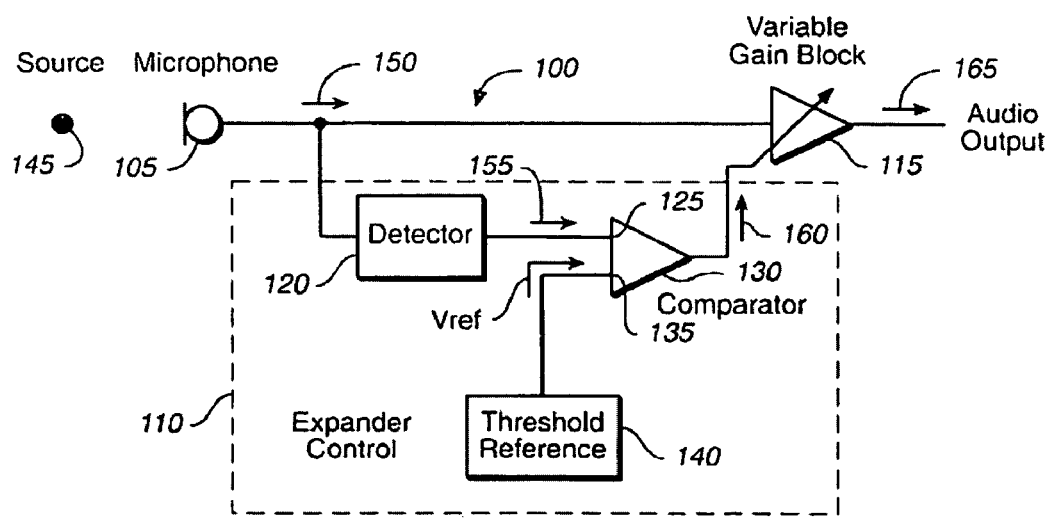
FIG. 1 illustrates a block diagram of a prior art expander system.
Figure 2:
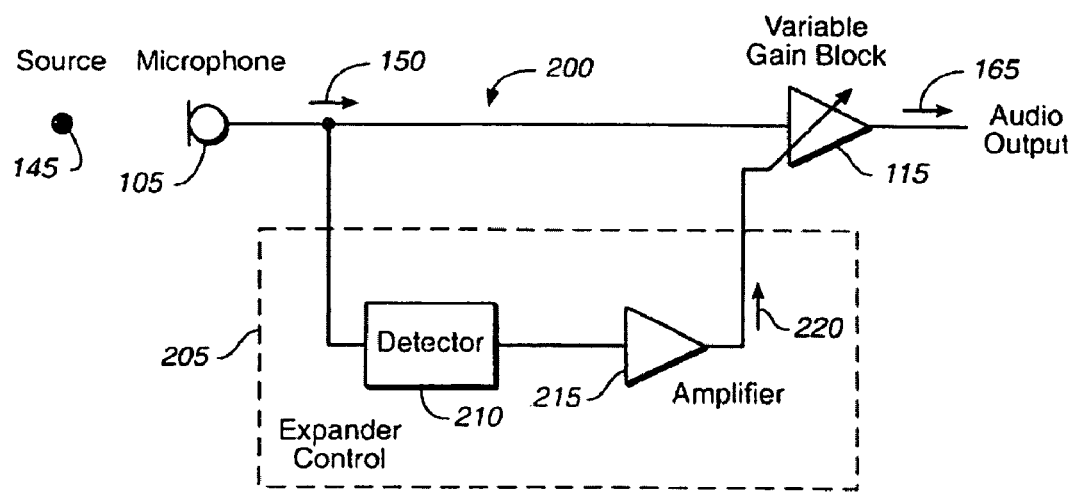
FIG. 2 illustrates a block diagram of a further example of a prior art expander system.
Figure 3:
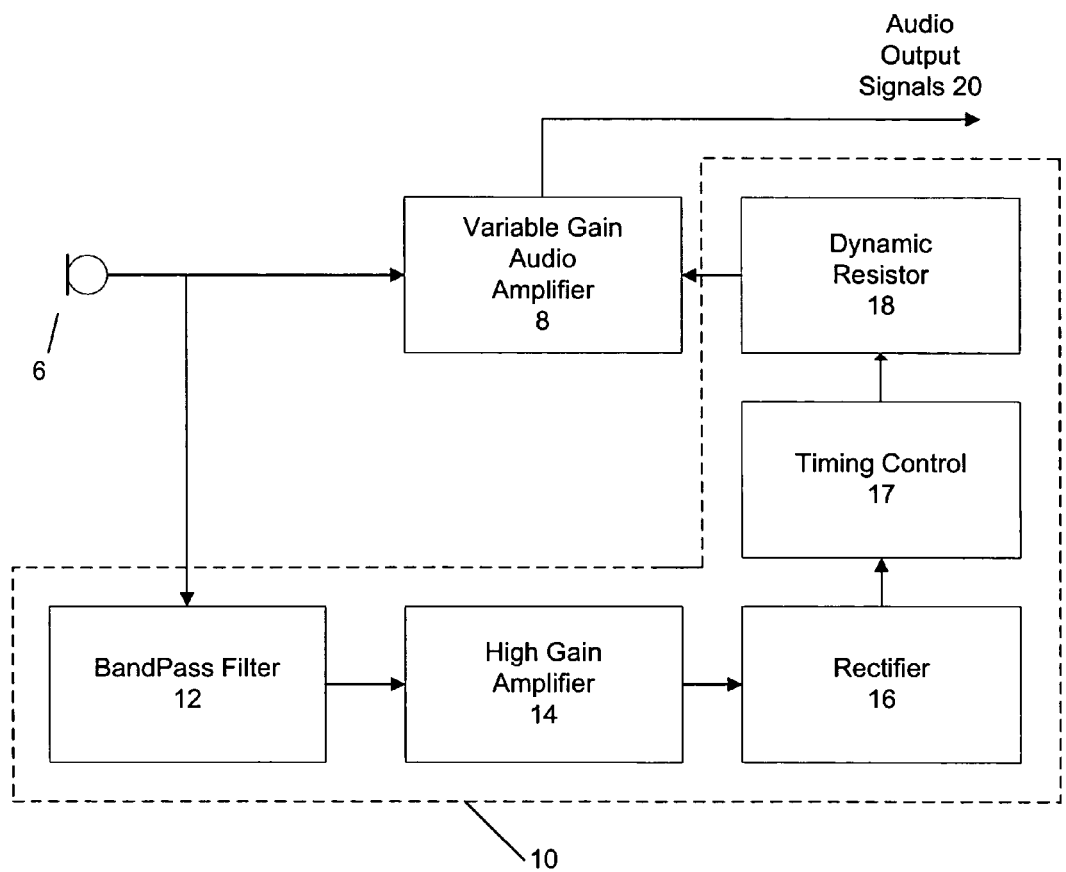
FIG. 3 illustrates a block diagram of an expander system in one example of the invention.

FIG. 3 illustrates a block diagram of a signal expander system 2 in accordance with a first example of the present invention. The signal expander system 2 is suitable for use, for example with a headset or other applications that provide non linear gain characteristics and which benefit from reduced noise in a transmit signal. The signal expander system 2 is advantageously used to provide voice expansion with reduced distortion. Signal expander system 2 reduces background noise and provides a smooth noise to speech level transition. The signal expander system 2 is capable of detecting the sound generated by an acoustic source and includes a microphone transducer such as an electret condenser microphone element 6 coupled to a transmit amplifier such as variable gain audio amplifier stage 8 and to an expander control stage 10.

The expander control stage 10 is also coupled to the variable gain audio amplifier stage 8. The expander control stage 10 includes a band pass filter 12, high gain amplifier stage 14, rectifier 16, timing control stage 17, and dynamic resistor stage 18. The variable gain audio amplifier stage 8 produces the amplified audio output signals 20. In further examples, the signal expander system 2 may also have fewer or additional functional blocks than those illustrated in FIG. 3. The band pass filter 12, high gain amplifier stage 14, and rectifier 16 of expander control stage 10 generate a D.C. level signal dependent on whether the microphone output electrical signals contain energy associated with user speech, i.e., the input signal to the microphone is a voice signal. The D.C. level controls the resistance of the dynamic resistor stage 18 which in turn controls the gain of the variable gain audio amplifier 8.

Figure 5:
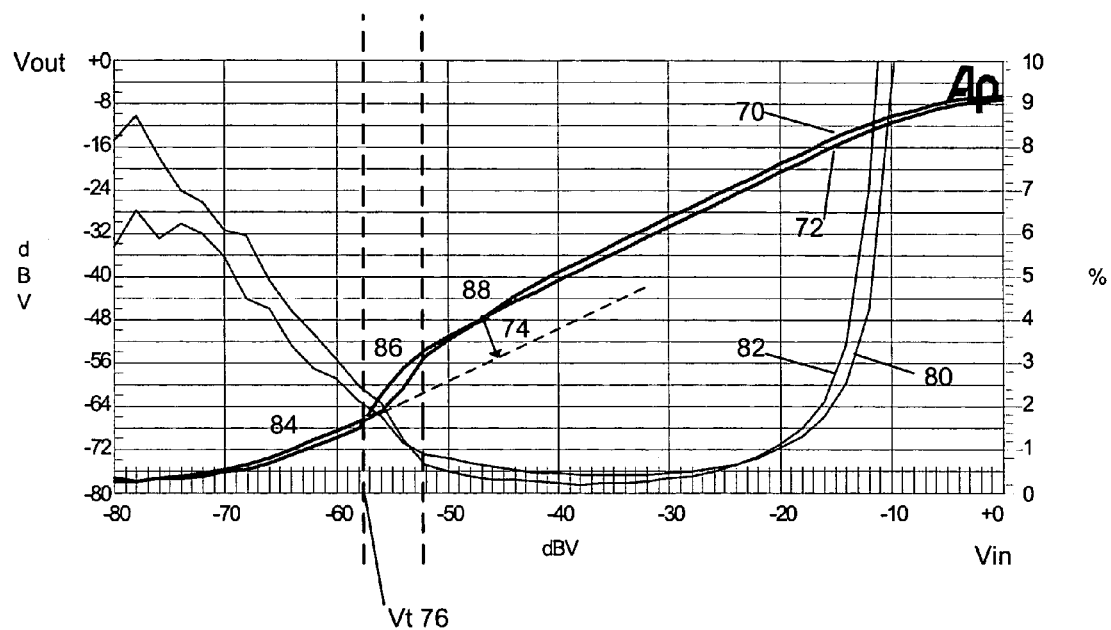
FIG. 5 illustrates a diagram of input/output characteristics of the circuit illustrated in FIG. 4.

Band pass filter 12 ensures that the D.C. level signal output by rectifier 16 is independent of the input signal frequency by "boosting" higher frequencies. This allows lower energy high frequency components to generate a comparable output D.C. level to higher energy low frequency components. The impedance of dynamic resistor stage 18 is thus designed to be frequency independent and the gain of variable gain audio amplifier stage 8 is frequency independent. Band pass filter 12 further acts to initiate the gain change from no voice signal to voice signal for higher frequencies more quickly than for low frequencies, as illustrated in FIG. 5. Since background noise is typically at lower frequencies, the earlier switching of high frequencies reduces noise effects in the audio output signals 20.

Rectifier 16 receives the amplified A.C. input signal from high gain amplifier stage 14 and rectifies the signal to produce a D.C. signal. The D.C. signal output from rectifier 16 is provided to dynamic resistor state 18. The impedance of dynamic resistor stage 18 is dependent on the value of the received D.C. signal as described below in reference to FIG. 4.

Timing control stage 17 determines attack and release times. Timing control stage 17 includes resistor 439, resistor 442, and capacitor 353. The values of resistor 439, resistor 442, and capacitor 353 are selected so circuit 22 has fast attack and slow release times.

Figure 4:
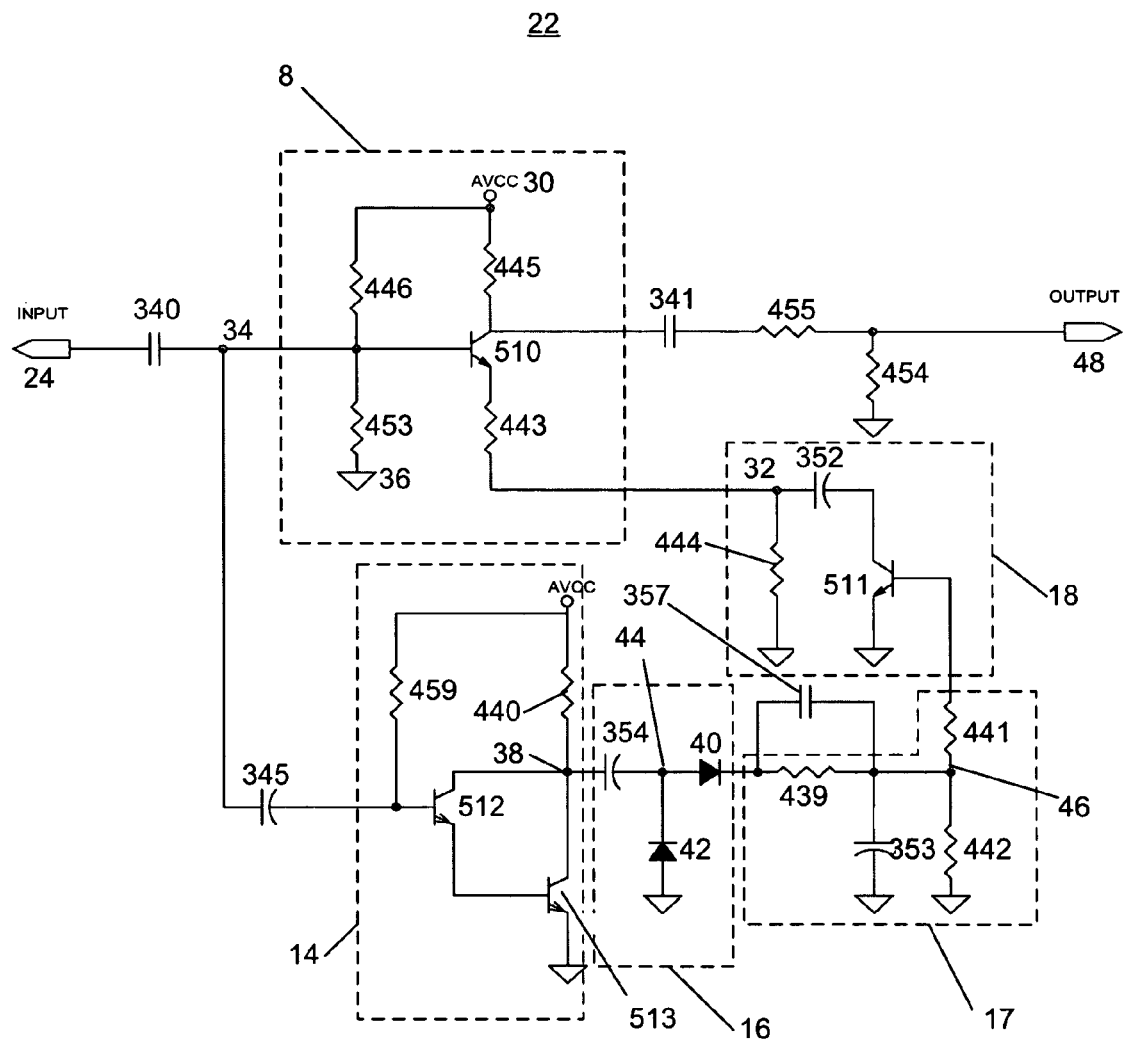
FIG. 4 illustrates a circuit implementing the expander system shown in FIG. 3.

The basic operation of signal expander system 2 can be considered on the basis of the block diagram illustration of FIG. 3. Achievement of some of the objectives of the invention can best be understood by consideration of the specific circuits of FIG. 4. Merely as an example, FIG. 4 illustrates a simplified detailed diagram of a circuit 22 which may be used to implement the block diagram of FIG. 3. A variety of components and component arrangements may be used to implement the functions set forth in FIG. 3.

Circuit 22 may, for example, be implemented with discrete components as it has relatively few components. Alternatively, circuit 22 may be implemented on an integrated circuit. Circuit 22 includes an input terminal 24 and output terminal 48. Circuit 22 includes an appropriate connection via power supply conductors to a D.C. power supply. Electret condenser microphone element 6 shown in FIG. 3 is typically a high source impedance, low voltage device which is coupled to circuit 22 via input terminal 24. As shown in FIG. 4, in one example of the invention a variable gain audio amplifier stage 8 comprises emitter current feedback configuration. An input terminal 24 is coupled to the variable gain audio amplifier stage 8 via a capacitor 340. Capacitor 340 acts to couple the A.C. input signals and decouple the D.C. voltage from a front stage. The collector of a transistor 510 is coupled to a supply voltage 30 via a resistor 445. Transistor 510 may, for example, be a npn BJT transistor. The emitter of transistor 510 is coupled to the dynamic resistor stage 18 at a circuit point 32 via a resistor 443. A first end of a resistor 446 is coupled to a circuit point 34. Circuit point 34 is coupled to the base of transistor 510. The second end of resistor 446 is coupled to supply voltage 30. A first end of a resistor 453 is also coupled to circuit point 34. The second end of resistor 453 is coupled to ground 36.

The input terminal 24 is also coupled to high gain amplifier stage 14 comprising a Darlington pair configuration via capacitor 340 and capacitor 345. Capacitor 345 is a component of band pass filter 12. Capacitor 345 and capacitor 354 form two stages of high pass networks to boost higher frequencies. Capacitor 357 enables faster charging of capacitor 353 to obtain consistent expansion at higher frequencies. High gain amplifier stage 14 includes a transistor 512, transistor 513, resistor 459 and resistor 440. Transistors 512 and 513 may, for example, be npn BJT transistors or in an additional example, MOSFET transistors. The emitter of transistor 512 is coupled to the base of transistor 513. The collector of transistor 512 is coupled to the collector of transistor 513 at a circuit point 38. The emitter of transistor 513 is coupled to ground 36. A first end of a resistor 459 is coupled to the base of transistor 512. The second end of transistor 459 is coupled to supply voltage 30. A first end of a resistor 440 is coupled to the supply voltage 30 and the second end of resistor 440 is coupled to circuit point 38.

The output of high gain amplifier stage 14 is coupled to a full wave rectifier 16 via circuit point 38. Rectifier 16 includes a capacitor 354, diode 40 and diode 42. A first end of capacitor 354 is coupled to circuit point 38. The second end of capacitor 354 is coupled to a circuit point 44. A diode 42 is coupled between the ground 36 and circuit point 44. A diode 40 is coupled between circuit point 44 and timing control stage 17 to transmit the rectified input signal from rectifier 16 to timing control stage 17.

Timing control stage 17 includes a resistor 439, capacitor 353, resistor 441, and resistor 442. A second component of band pass filter 12, filter capacitor 357, is placed across a resistor 439. A first end of resistor is coupled to a second end of diode 40. The second end of resistor 439 is coupled to a circuit point 46. Circuit point 46 is coupled to a first end of capacitor 353 and a first end of resistor 442. A second end of capacitor 353 and second end of resistor 442 are coupled to ground. A first end of a resistor 441 is also coupled to circuit point 46.

Dynamic resistor stage 18 includes a transistor 511, capacitor 352, and resistor 444. The base of transistor 511 is coupled to the second end of resistor 441. The emitter of transistor 511 is coupled to ground 36 and the collector of transistor 511 is coupled to a first end of capacitor 352. The second end of capacitor 352 is coupled to circuit point 32. A first end of resistor 444 is coupled to circuit point 32 and a second end of resistor 444 is coupled to ground 36. In operation, transistor 511 is a BJT transistor operated in "intersection" mode as referred to by the inventor. When operated in intersection mode the collector current $i_c=0$ and voltage $v_{ce}$ between collector and emitter is equal to zero unlike operation in active or saturation mode.

The impedance $Z_0$ of dynamic resistor stage 18 as seen by variable gain audio amplifier stage 8 may be expressed as:

$$Z_0 = dv_{ce}/di_c = 1/[g_m dv_{be}/dv_{ce} + g_{ce}]$$

where $v_{be}$ is the D.C. level output from rectifier 16, $dV_{be}$ is the D.C. level change, $v_{ce}$ is the A.C. voltage change between the collector and emitter of transistor 511, $i_c$ is the collector current of transistor 511, $g_n$, is the transconductance (also referred to as mutual conductance) of transistor 511 ($i_c$ change rate to $v_{be}$), and $g_{ce}$ is the transconductance of transistor 511 ($i_c$ change rate to $v_{ce}$).

The mid-band gain of variable gain audio amplifier stage 8 may be expressed as:

$$A_0 = -(h_{fe} * R_c)/(R_s + h_{ie} + h_{fe} * R_e)$$

where $h_{fe}$ is the transistor gain, $h_{ie}$ is the transistor input resistance, $R_e$ is the collector resistance (R445), $R_s$ is the source resistance, $R_e$ is the emitter resistance (the parallel combination of R444 and output resistance of transistor 511). For example, $R_e$ may be selected to be 1 to 2 kohms. In expansion mode, output resistance of transistor 511 is the dominant factor.

The mid-band gain of variable gain audio amplifier stage 8 as a function of $Z_0$ may be expressed as:

$$A_0 = -(h_{fe} * R_c)/\{R_s + h_{ie} + h_{fe} * [R_e * Z_0/(R_e + Z_0)]\}$$

where $A_0$ is the gain of the variable audio amplifier, hfe is the transistor gain, hie is the transistor input resistance, Rc is the collector resistance (R445), Re is the emitter resistance (R444), Zo is the output resistance of transistor 511. In expansion Mode $Z_0$ is the dominant factor.

In non-expansion mode, $Z_0$ is very large. For example, $Z_0$ may be larger than 100 kohms. In non-expansion mode, the gain is approximately:

$$A_0 = -(h_{fe} * R_c)/(R_s + h_{ie} + h_{fe} * R_e)$$

In expansion transition mode, $Z_0$ decreases in value. For example, $Z_0$ may decrease from 100 kohms to approximately 100 ohms. In expansion transition mode, the gain may be approximated as:

$$Ao = -(hfe * Rc)/\{Rs + hie + hfe * [Re * Zo/(Re + Z_0)]\}$$

In expansion mode, $Z_0$ is relatively small in value. For example, $Z_0$ may be less than 100 ohms. In expansion mode, the gain may be approximated as:

$$A_0 = -(h_{fe} * R_c)/(R_s + h_{ie})$$

Thus, in non expansion mode the gain can be designed to be about 10 dB lower than in expansion mode. Since $i_c=0$ for transistor 511 in dynamic resistor stage 18, distortion in the output of variable gain audio amplifier stage 8 is minimized.

The output of variable gain audio amplifier stage 8 is coupled to an output terminal 48 via an output stage including a capacitor 341, resistor 455 and resistor 454. A first end of capacitor 341 is coupled to the collector of transistor 510. The second end of capacitor 341 is coupled to a first end of resistor 455. The second end of resistor 455 is coupled to output terminal 48. A first end of resistor 454 is coupled to output terminal 48 and a second end of resistor 454 is coupled to ground.

Figure 6:
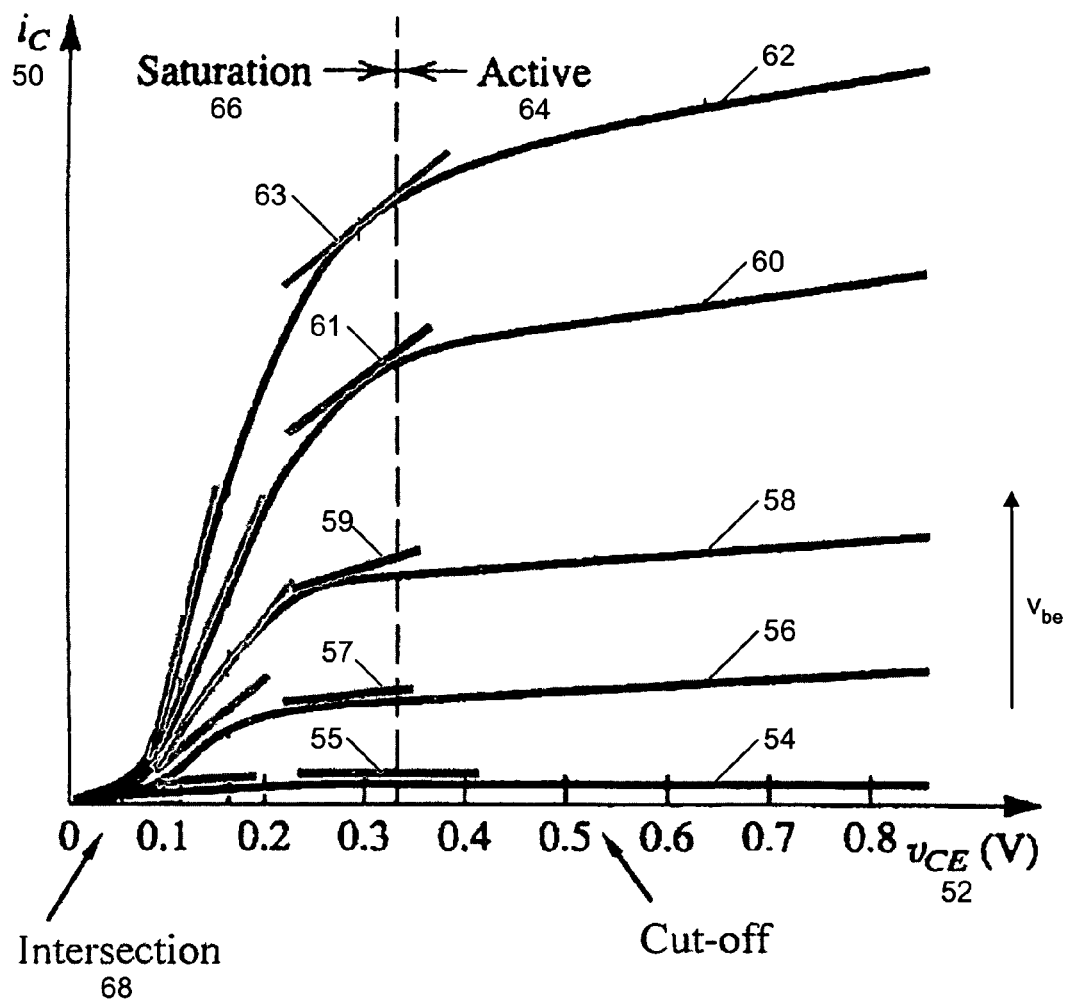
FIG. 6 illustrates a plot of characteristic curves of a bipolar junction transistor used as a dynamic resistor in an example of the invention.

FIG. 6 illustrates a plot of characteristic curves of a bipolar junction transistor used as a component of a dynamic resistor stage 18 in an example of the invention. FIG. 6 illustrates collector current $i_c$ 50 vs. collector-emitter voltage $v_{ce}$ 52 curve 54, 56, 58, 60, and 62 for a series of fixed values of D.C. level signals output from rectifier 16 ($v_{be}$). As shown in FIG. 6, the slopes 55, 57, 59, 61, and 63 of respective curves 54, 56, 58, 60, and 62 increase with increasing $v_{be}$. As described above, the impedance $Z_0$ is equal to $dv_{ce}/di_c$. Thus, $Z_0$ is larger for curves with a smaller slope (e.g. slope 55) than curves with a larger slope (e.g. slope 63). For example, where $v_{be}$ is zero (i.e., a noise signal), curve 54 has a small slope 55 and $Z_0$ is very large and approximates an open circuit. In this state, the variable gain audio amplifier stage 8 is in low gain mode, approximately 8-10 db lower gain than for a voice signal.

Where $v_{be}$ is a high D.C. level signal corresponding to a voice signal, the slope is greater and $Z_0$ is smaller. As shown in FIG. 6, the slope of a given curve varies depending on the mode of operation of the transistor. In the active region 64, the slope is smaller than the slope in the saturation region 66. In intersection mode 68, the slope is greatest. By operating transistor 511 in intersection mode, it is possible to obtain the lowest $Z_0$ for a given $v_{be}$. Where a speech signal is over a certain level, the amplifier gain of variable gain audio amplifier stage 8 is constant. However, there is a transition region from low gain to high gain for a D.C. voltage range prior to that level. One aspect of the present invention is that a smooth transition is provided. In this manner $Z_0$ varies continuously with the value of the D.C. signal, producing a smooth gain curve, as illustrated in FIG. 5.

In operation, the value of resistor 443 and $Z_0$ are advantageously selected to provide a gain change of about 8-10 db for a speech signal. One of ordinary skill in the art will recognize that lower or higher gain values may be selected by adjusting the values of resistor 443 and $Z_0$.

In operation, referring to FIG. 5, circuit 22 may provide an output voltage $V_{out}$ as a function of $V_{in}$, corresponding to a low gain region 84, gain change region 86, and high gain region 88. When $\backslash T_{in}$ is low, corresponding to ambient noise and no user voice signal, the D.C. output voltage $v_{be}$ from rectifier 16 is zero or near zero and $Z_0$ is therefore very large. The resulting gain of circuit 22 is low.

When $V_{in}$ is at a level in gain change region 86, corresponding to a quiet voice signal higher than the ambient noise level, the D.C. output voltage from rectifier 16 rises so the D.C. output voltage $v_{be}$ from rectifier 16 rises and $Z_0$ decreases in value. The decrease in value of $Z_0$ is seen by variable gain audio amplifier stage 8 and the resulting gain of circuit 22 increases. The attack time constant is controlled by the value of resistor 449 multiplied by the value of capacitor 353 shown in FIG. 4.

Referring again to FIG. 5, when $V_b$, is at a level in high gain region 88, corresponding to a normal speech signal, the D.C. output voltage from rectifier 16 is at its highest level resulting in a low value of $Z_0$. The resulting gain of circuit 22 is high. When $V_{in}$ drops lower than a level corresponding to a normal speech level signal, the D.C. output voltage from rectifier 16 decreases and the resulting gain of circuit 22 decreases. The release time constant is controlled by the value of resistor 442 multiplied by the value of capacitor 353 shown in FIG. 4. As a result, circuit 22 provides for lowered background noise and a smooth noise to speech level transition.

For example, the circuit 22 may be used with linear omnidirectional microphones which are prone to picking up undesirable ambient noise. When the voice expansion functionality is added to microphones used in close talk devices, background noise can be reduced during non-speech periods. For example, a typical reduction of gain during non-speech periods may be 8-10 dB. In situations with reasonable signal to background noise ratio, the non speech periods are when background noise is most apparent. Additionally, in telephone applications where side tone directs local microphone signals to the user's own receiver, reduction of sidetone-produced background noise is achieved with circuit 22. For example, attack time constants may be chosen to capture beginnings of words effectively, such as 5 to 15 milliseconds. Release times may be set to allow for slight pauses, such as 60 to 200 milliseconds.

Referring again to FIG. 5, a gain curve 70 for higher frequencies and a gain curve 72 for lower frequencies is illustrated. Expansion circuit 22 provides a gain change increase above a threshold voltage $V_t$ 76. Below $V_t$ 76, only a noise signal is present and no expansion is utilized. Also illustrated in FIG. 5 are distortion plots 80, 82 for gain curves 70, 72 respectively showing low distortion of approximately 1 percent over a range of approximately 35 db. Circuit 22 reduces distortion by operating transistor 511 in intersection mode where $i_c=0$ so that current is not drawn in the emitter of transistor 510.

Although example circuit configurations have been described in one example of the invention, one of ordinary skill in the art will recognize that except as otherwise described herein other configurations and components may be used for variable gain audio amplifier stage 8, high gain amplifier stage 14, rectifier 16, timing control stage 17, and dynamic resistor stage 18. While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What is claimed is:

1. An expander circuit comprising:
  a transmit amplifier for amplifying electrical signals received from a microphone;
  a rectifier circuit responsive to the electrical signals for generating a D.C. voltage; and
  a dynamic resistor circuit coupled to the transmit amplifier for regulating a gain of the transmit amplifier, the dynamic resistor circuit comprising:
    a bipolar junction transistor for receiving the D.C. voltage operated in a mode where the bipolar junction transistor D.C. collector current is zero, wherein the bipolar junction transistor has a variable impedance seen by the transmit amplifier dependent upon the D.C. voltage.

2. The expander circuit of claim 1, further comprising a high gain amplifier for amplifying the electrical signals to generate amplified electrical signals, wherein the amplified electrical signals are provided to the rectifier circuit.

3. The expander circuit of claim 2, wherein the high gain amplifier utilizes a Darlington pair configuration.

4. The expander circuit of claim 2, further comprising a band pass filter for boosting high frequency signals in the electrical signals.

5. The expander circuit of claim 4, wherein the band pass filter comprises a capacitor coupled between the high gain amplifier and the microphone.

6. The expander circuit of claim 1, further comprising a band pass filter for initiating gain change for higher frequencies in the electrical signals prior to gain change of lower frequencies in the electrical signals.

7. The expander circuit of claim 1, further comprising a timing control circuit for setting an attack time constant and a release time constant.

8. The expander circuit of claim 7, wherein the attack time constant is between 5 and 15 milliseconds and the release time constant is between 60 and 200 milliseconds.

9. The expander circuit of claim 1, wherein the D.C. voltage is dependent on whether the electrical signals contain energy associated with user speech.

10. The expander circuit of claim 9, wherein the transmit amplifier increases gain by 8-10 dB for electrical signals containing energy associated with user speech.

11. The expander circuit of claim 1, wherein the transmit amplifier comprises an emitter current feedback amplifier configuration utilizing a transmit amplifier bipolar junction transistor.

12. The expander circuit of claim 11, wherein the dynamic resistor circuit is coupled to an emitter of the transmit amplifier bipolar junction transistor.

13. An expander circuit comprising:
  an amplifying means for amplifying electrical signals received from a microphone;
  a rectifying means for receiving the electrical signals and for generating a D.C. voltage; and
  an impedance means coupled to the amplifying means for regulating a gain of the amplifying means, the impedance means comprising a bipolar junction transistor for receiving the D.C. voltage operated in a mode where a D.C. collector current is zero, wherein the bipolar junction transistor has a variable impedance seen by the amplifying means dependent upon the D.C. voltage.

14. The expander circuit of claim 13, further comprising a high gain amplifying means for amplifying the electrical signals to generate amplified electrical signals, wherein the amplified electrical signals are provided to the rectifying means.

15. The expander circuit of claim 13, further comprising a filter means for boosting high frequency signals in the electrical signals.

16. The expander circuit of claim 13, further comprising a timing means for setting attack time and release time constants.

17. The expander circuit of claim 13, wherein the D.C. voltage is dependent on whether the electrical signals contain energy associated with user speech.

18. The expander circuit of claim 17, wherein the amplifying means increases gain by 8-10 dB for electrical signals containing energy associated with user speech.

19. An expander circuit comprising:
   a transmit amplifier for amplifying electrical signals received from a microphone;
   a rectifier circuit responsive to the electrical signals received from the microphone adapted to generate a varying D.C. voltage; and
   a dynamic resistor circuit coupled to the transmit amplifier for varying a gain of the transmit amplifier during detection of speech, the dynamic resistor circuit comprising a transistor for receiving the varying D.C. voltage wherein the transistor has a continuously varying impedance seen by the transmit amplifier dependent upon the varying D.C. voltage.

20. The expander circuit of claim 19, further comprising a high gain amplifier for amplifying the electrical signals to generate amplified electrical signals, wherein the amplified electrical signals are provided to the rectifier circuit.

* * * * *